(12) United States Patent  
Afentakis et al.

(10) Patent No.: US 7,532,187 B2  
(45) Date of Patent: May 12, 2009

(54) DUAL-GATE TRANSISTOR DISPLAY

(75) Inventors: Themistokles Afentakis, Vancouver, WA (US); Apostolos T. Voutsas, Portland, OR (US); Paul J. Schuele, Washougal, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 672 days.

(21) Appl. No.: 11/184,699

(22) Filed: Jul. 18, 2005

(65) Prior Publication Data

US 2006/0066512 A1 Mar. 30, 2006

Related U.S. Application Data

(63) Continuation-in-part of application No. 10/953,913, filed on Sep. 28, 2004, now abandoned.

(51) Int. Cl.
*G09G 3/36* (2006.01)
*G09G 3/32* (2006.01)

(52) U.S. Cl. .......................... 345/92; 345/82
(58) Field of Classification Search ............. 345/87–93, 345/60, 64, 76–83
See application file for complete search history.

(56) References Cited

U.S. PATENT DOCUMENTS

| 5,017,983 | A | 5/1991 | Wu ............................ 257/61 |
| 5,658,806 | A | 8/1997 | Lin et al. .................... 438/157 |
| 5,808,595 | A * | 9/1998 | Kubota et al. ................ 345/92 |
| 5,818,070 | A | 10/1998 | Yamazaki et al. ............. 257/72 |
| 6,300,977 | B1 * | 10/2001 | Waechter et al. ............ 348/300 |
| 6,433,609 | B1 * | 8/2002 | Voldman ..................... 327/313 |
| 6,528,852 | B2 | 3/2003 | Takemura ................... 257/350 |
| 6,534,788 | B1 | 3/2003 | Yeo et al. ...................... 257/72 |
| 6,563,136 | B2 | 5/2003 | Kunii ........................... 257/72 |
| 6,603,453 | B2 | 8/2003 | Yamazaki et al. ............. 345/92 |
| 6,611,023 | B1 | 8/2003 | En et al. ..................... 257/350 |
| 6,628,363 | B1 | 9/2003 | Sano et al. .................. 349/151 |
| 6,646,307 | B1 | 11/2003 | Yu et al. ..................... 257/347 |
| 6,673,661 | B1 | 1/2004 | Liu et al. .................... 438/157 |
| 6,740,938 | B2 | 5/2004 | Tsunoda et al. ............. 257/365 |
| 6,795,049 | B2 * | 9/2004 | Toyoshima et al. ........... 345/93 |
| 2003/0030381 | A1 * | 2/2003 | Yamazaki et al. ......... 315/169.1 |
| 2004/0129933 | A1 * | 7/2004 | Nathan et al. ................. 257/40 |
| 2004/0165129 | A1 * | 8/2004 | Okumura ..................... 349/114 |
| 2004/0174349 | A1 * | 9/2004 | Libsch et al. ................ 345/204 |

* cited by examiner

*Primary Examiner*—Chanh Nguyen
*Assistant Examiner*—Robert M Stone
(74) *Attorney, Agent, or Firm*—Law Office of Gerald Maliszewski; Gerald Maliszewski

(57) ABSTRACT

A dual-gate thin-film transistor (DG-TFT) voltage storage circuit is provided. The circuit includes a voltage storage element, a DG-TFT having a first source/drain (S/D) connected to a data line, a top gate connected to a first gate line, a second S/D region connected to the voltage storage element, and a bottom gate connected to a bias line. In one aspect, the circuit further includes a voltage shifter having an input connected to the first gate line and an output to supply a bias voltage on the bias line. Examples of a voltage storage element include a capacitor, a liquid crystal (LC) pixel, and a light emitting diode (LED) pixel.

18 Claims, 9 Drawing Sheets

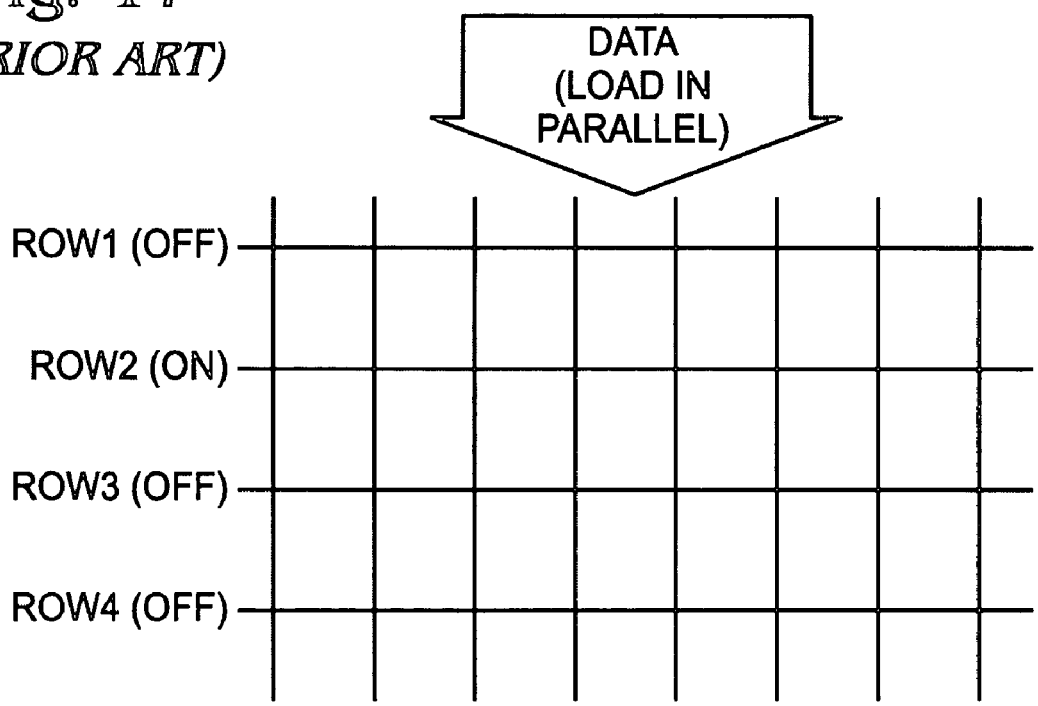

DUAL-GATE TRANSISTOR DISPLAY

RELATED APPLICATIONS

This application is a continuation-in-part of a patent application entitled, DUAL-GATE THIN-FILM TRANSISTOR, invented by Scheule et al., Ser. No. 10/953,913, filed Sep. 28, 2004 now abandoned. This application is incorporated herein by reference.

BACKGROUND OF THE INVENTION

1. Field of the Invention

This invention generally relates to integrated circuit (IC) and liquid crystal display (LCD) fabrication and, more particularly, to a display with pixel elements controlled using a dual-gate thin-film transistor (DG-TFT).

2. Description of the Related Art

In order to achieve high contrast and minimize crosstalk in a display system, such as a liquid display or a light-emitting diode panel, it is important to employ an active matrix (AM) architecture, where one or more active devices are used in each pixel to control the pixel switching characteristics. Various AM architectures exist, varying in complexity and principles of operation. Generally, a tradeoff exists between switching speed (fast refresh times) and storage time (low current leakage). Greater pixel functionality can be obtained by using a greater number of active elements to control the pixel. Of course, since the dimensions of the pixel are fixed, the number of thin-film transistors (TFTs) that can be incorporated into each pixel cannot be arbitrarily large. As soon as a pixel architecture is implemented, the switching characteristics of the pixel (i.e. how fast it can charge/discharge to the new voltage/current values as the picture is refreshed) are considered fixed.

FIG. 13 is a schematic drawing depicting two examples of conventional active matrix system pixels (prior art). In many embodiments, the display is built on a temperature-sensitive substrate, such as glass, necessitating the use of amorphous-Si or polycrystalline Si TFTs formed at low temperature. When enabled in the ON state, the switching TFT activates a constant current (or voltage) source that controls the liquid crystal or light emitting element (left schematic). A simplified representation is shown to the right, where the source/light element combination is replaced by an equivalent load impedance $Z_L$.

FIG. 14 is a schematic depicting a conventional LCD display pixel architecture, employing amorphous-Si or low-temperature polycrystalline silicon N-channel TFTs (prior art). Vdata is the data (column) line, Vr1 and Vr2 are two consecutive row selection lines, $C_S$ is the storage capacitor, $C_{LC}$ is the liquid crystal (LC) element (a light valve), and $V_C$ the potential across the LC, which determines the light intensity of that specific pixel.

FIG. 15 is a signal diagram for the circuit of FIG. 14 (prior art). A typical running sequence for this pixel, not including parasitic effects (such as the parasitic gate-source capacitance of the TFT), is shown. Assume that the Vr2 line (the row line for the next row of pixels) is de-activated, i.e. at a negative voltage. When Vr1 switches ON (positive voltage), the switching transistor turns ON. The voltage level present at Vdata then propagates through the TFT and charges the storage capacitor Cs and the liquid crystal element capacitance ($C_{LC}$). The time it takes to store this value is indicated by $t_{rise}$ in the plot of output voltage $V_C$. $t_{rise}$ is a function of the channel resistance of the TFT, itself a function of mobility and threshold voltage, and the charging capacitors $C_S$ and $C_{LC}$.

After the capacitors have charged, Vr1 turns OFF (i.e. negative), and the TFT turns OFF. Ideally, the programmed value $V_C$ should stay constant. However, the voltage changes slightly because of leakage through the TFT. The TFT has a finite channel resistance in its OFF state. This leakage is indicated by $V_{leak}$ in the plot of $V_C$. The brightness of the pixel is controlled by VC, so $V_{leak}$ is minimized to prevent changes in an image with respect to time. When a pixel is to be programmed again (a negative value of Vdata), Vr1 turns on again, and the charging-retaining process described above is repeated.

FIG. 16 is a schematic drawing of a conventional LED pixel architecture (prior art). In the case of a light-emitting diode active matrix display, an individual LED is built in each pixel. The depicted pixel architecture employs PMOS TFTs.

Here, a constant power supply line (VDD) is required for all pixels. The timing diagram would be similar to that of the LCD pixel (FIG. 15). When Vr1 turns ON, TFT M1 turns ON, causing the value in Vdata to be stored in storage capacitor $C_S$. This capacitor is across the gate-source terminals of M2, which then acts a constant current supply for the LED. When Vr1 turns OFF, M1 turns OFF, and the charge stored in Cs continues to induce a constant current through the LED via M2.

As with the LCD pixel, there is a rise time associated with the charging of $C_S$ through M1, determined partly by the threshold voltage of M1, as well as a loss in the programmed voltage across Cs due to leakage through M1, when M1 is OFF.

FIG. 17 is a schematic diagram of a conventional active-matrix system (prior art). Pixel data is loaded in parallel (i.e. simultaneously in all columns). The row in which the Data is stored is determined by the currently-on Row (in this case Row2). In the next time instance, Row2 will be off, Row3 will be on, and a new set of Data will be present.

It would be advantageous if the both the switching time and leakage current of a display pixel element could be improved without increasing the number of TFT's associated with the pixel.

SUMMARY OF THE INVENTION

The present invention involves the use of a dual-gate TFT (DG-TFT) as the switching element in each AM pixel, to adjust the pixel switching characteristics dynamically, in real time. This approach has the advantage of circumventing tradeoffs in pixel design, since the DG-TFT can be switched to have optimum characteristics in each mode of display operation. That is, a low threshold voltage can be set during refresh operations, for fast switching. In the pixel OFF mode, the DG-TFT can be set to a high threshold voltage, to minimize the leakage current.

Accordingly, a DG-TFT voltage storage circuit is provided. The circuit comprises a voltage storage element, a DG-TFT having a first source/drain (S/D) connected to a data line, a top gate connected to a first gate line, a second S/D region connected to the voltage storage element, and a bottom gate connected to a bias line. In one aspect, the circuit further comprises a voltage shifter having an input connected to the first gate line and an output to supply a bias voltage on the bias line. Examples of a voltage storage element include a capacitor, a liquid crystal (LC) pixel, and a light emitting diode (LED) pixel.

A method for controlling a DG-TFT voltage storage circuit is also provided. The method comprises: supplying a DG-TFT voltage storage circuit, as described above; supplying an OFF voltage to the gate line; in response to the OFF voltage, disabling current through the DG-TFT to the voltage storage element; supplying a first bias voltage to the bias line; and, decreasing the leakage current through the DG-TFT in response to the first bias voltage.

Alternately, the method comprises: supplying an analog (storage) voltage to the data line; supplying an ON voltage to the gate line; enabling current flow through the DG-TFT to the voltage storage element; supplying a second bias voltage to the bias line; and, decreasing the threshold voltage of the DG-TFT in response to the second bias voltage.

Additional details of the above-described DG-TFT voltage storage circuit and method of control are provided below, along with an explanation of a display array made from DG-TFT voltage storage circuits.

BRIEF DESCRIPTION OF THE DRAWINGS

FIG. 17 is a schematic diagram of a conventional active-matrix system (prior art).

DETAILED DESCRIPTION

Figure 1:
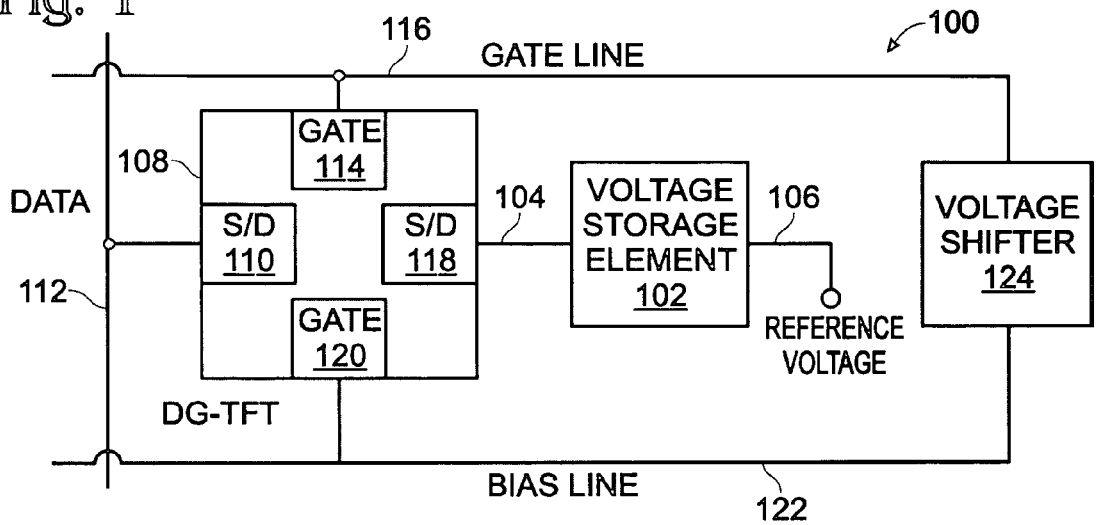
FIG. 1 is a schematic block diagram of a dual-gate thin-film transistor (DG-TFT) voltage storage circuit.

FIG. 1 is a schematic block diagram of a dual-gate thin-film transistor (DG-TFT) voltage storage circuit. The circuit 100 comprises a voltage storage element 102 having an input on line 104 and an output on line 106. A DG-TFT 108 has a first source/drain (S/D) 110 connected to a data line 112, a top gate 114 connected to a first gate line 116, a second S/D region 118 connected to the voltage storage element input 102 on line 104, and a bottom gate 120 connected to a bias line 122. The output of storage element 102 is shown as connected to a reference voltage (i.e., ground) on line 106.

Figure 2:
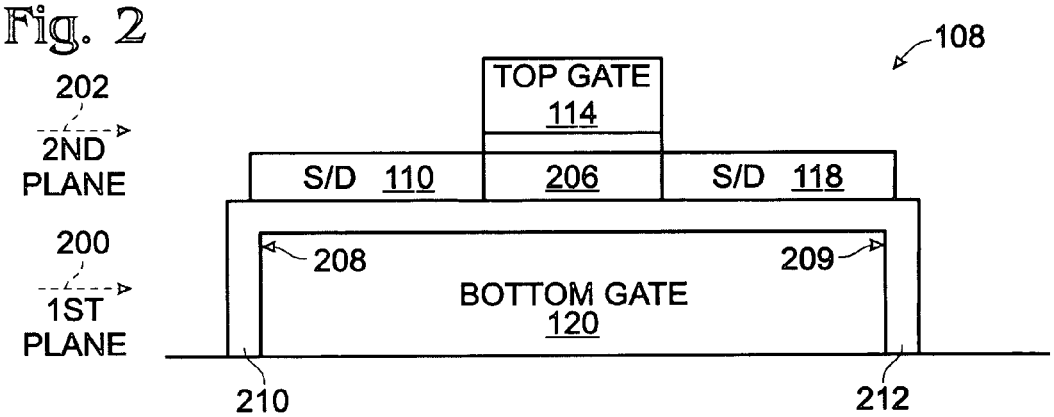
FIG. 2 is a partial cross-sectional view of an exemplary DG-TFT.

FIG. 2 is a partial cross-sectional view of an exemplary DG-TFT. The DG-TFT 108 has the DG-TFT bottom gate 120 aligned in a first horizontal plane 200. The first S/D region 110 and second S/D region 118 are aligned in a second horizontal plane 202, overlying the first plane 200. The top gate 114 is aligned in a third horizontal plane 204, overlying the second plane 202. A channel region 206 is formed in the second horizontal plane 202, intervening between the first S/D region 110 and the second S/D region 118. The bottom gate 120 has vertical sides 208 and 209, and insulating sidewalls 210 and 212 are formed over the bottom gate vertical sides 208 and 209, respectively. The first S/D region 110 and second S/D region 118 overlie the bottom gate 120, between the bottom gate vertical sides 208 and 209.

It should be noted that FIG. 2 describes one particular embodiment of a DG-TFT. Other DG-TFT devices, both conventional and proprietary (not shown) may also be used to enable the voltage storage circuit of FIG. 1.

Returning to FIG. 1, in some aspects the circuit 100 further comprises a voltage shifter 124 having an input connected to the first gate line 116 and an output to supply a bias voltage on the bias line 122. For example, in a first scenario the circuit 100 is enabled to store a voltage. Then, the first gate line accepts an OFF voltage. The voltage shifter 124 supplies a first bias voltage on line 122, and leakage current through the DG-TFT 108 decreases in response to the first bias voltage. In this scenario, leakage current is sourced by the voltage storage element 102, passing through the DG-TFT 108. For example, a simple voltage shifter could be a resistor divider network.

In a second scenario, the circuit 100 is enabled to quickly store or refresh a stored voltage. Then, the first gate line 116 accepts an ON voltage. It is assumed that an analog voltage, the desired storage value, is applied to data line 112. The voltage shifter 124 supplies a second bias voltage, and the voltage threshold of the DG-TFT 108 decreases in response to the second bias voltage. The above-mentioned examples are necessarily broad, to accommodate the description of both NMOS and PMOS type DG-TFTs. One skilled in the art would understand the relative voltage and bias levels needed to operate either kind of device.

The voltage storage element may be a capacitor, a liquid crystal (LC) pixel, or a light emitting diode (LED) pixel. However, other applications of above-described circuit exist. Examples of an LC pixel and LED pixel circuits follow.

Figure 3:
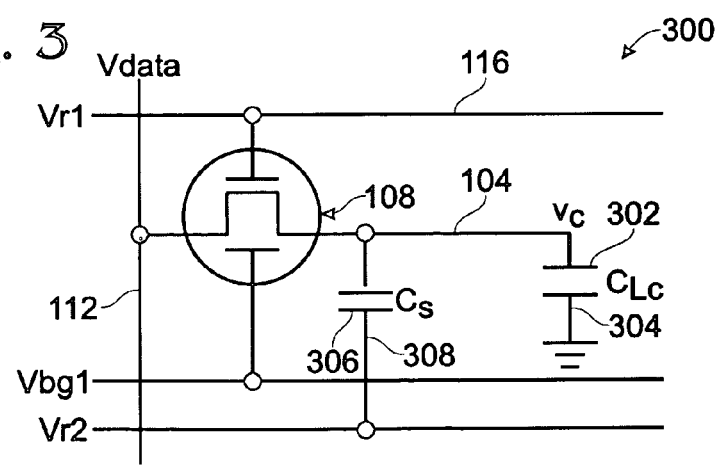
FIG. 3 is a schematic block diagram of a DG-TFT LC pixel circuit.

FIG. 3 is a schematic block diagram of a DG-TFT LC pixel circuit. The circuit 300 comprises an LC element 302 having a first terminal connected to the DG-TFT second S/D region on line 104, and a second terminal connected to a reference voltage on line 304. A storage capacitor 306 has a first terminal connected to the DG-TFT second S/D region on line 104, and a second terminal connected to a second gate line 308, adjacent the first gate line 116. For simplicity, the second gate line 308 may be represented as a reference voltage. Practically however, the storage capacitor of a pixel element is discharged into a neighboring gate line, to minimize the number of electrical interconnects that need be formed, and so minimize the size of the pixels.

It should be understood that the circuit of FIG. 3 is a very simple variation of an LC pixel. Other LC pixels (not shown) are more complex, incorporating additional active and passive components. Those skilled in the art would be able to apply the principles of the circuit of FIG. 3 to more complex variations.

Figure 4:
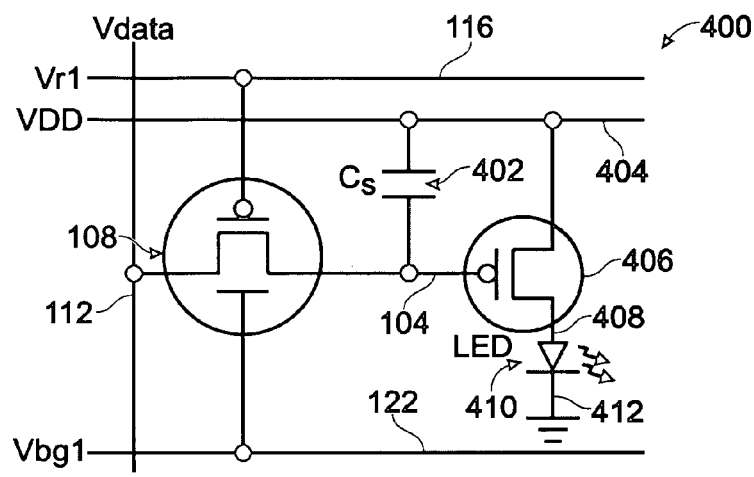
FIG. 4 is a schematic block diagram of DG-TFT LED pixel circuit.

FIG. 4 is a schematic block diagram of DG-TFT LED pixel circuit. The circuit 400 comprises a storage capacitor 402 having a first terminal connected to the DG-TFT second S/D region on line 104, and a second terminal connected to a dc voltage line 404. A current source 406 has a current input connected to the dc voltage line on line 404, a control input connected to the DG-TFT second S/D region on line 104, and a current output on line 408. An LED 410 has an input connected to the current source current output on line 408, and an output connected to a reference voltage on line 412. Here, the current source is simply a FET, however, other types of current sources are well known in the art.

Again, it should be understood that the circuit of FIG. 4 is a very simple variation of an LED pixel that is presented as an example to illustrate the invention. Other LED pixels (not shown) are more complex, incorporating additional active and passive components. Those skilled in the art would be able to apply the principles of the circuit of FIG. 4 to more complex variations. Likewise, it should be understood that the present invention voltage storage circuit has other storage applications, including other types of display circuitry.

Figure 5:
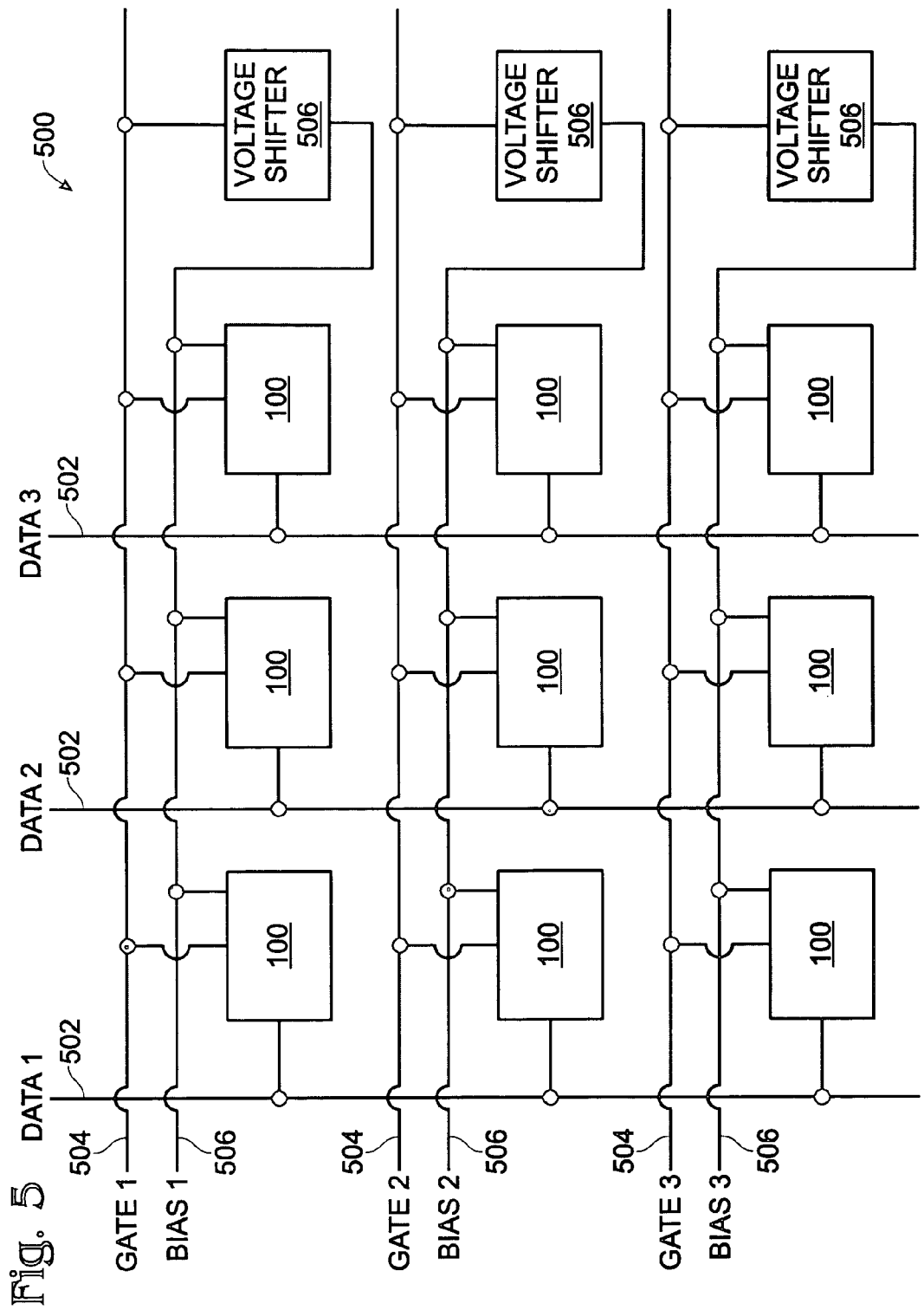
FIG. 5 is a schematic block diagram of a DG-TFT voltage storage matrix.

FIG. 5 is a schematic block diagram of a DG-TFT voltage storage matrix. The matrix 500 comprises a first plurality of data lines 502, a second plurality of gate lines 504, and a second plurality of bias lines 506. Each bias line 506 is associated with a corresponding gate line 504. Shown are three data lines and three gate (bias) lines. However, the matrix 500 is not limited to any particular number. A third plurality of DG-TFT voltage storage circuits 100 are shown, with a unique circuit 100 intervening between each data line 502 and each gate line 504. The voltage storage circuit 100 is as described in the explanation of FIG. 1 and will not be repeated here in the interest of brevity.

Conventionally, the data line does not turn ON or OFF, it only changes values depending on the desired voltage level to program the pixels. Each data line is shared by all pixels in the same column. So, when the gate line of a particular row (i.e., row 2) turns ON, the voltages present in the data lines are stored in the pixels. When it is time to program the next row, the data lines do not turn OFF. The gate lines for row 2 turn OFF, the data lines' voltages are changed to the desired values to program the next row (i.e. row 3), and the gate lines for row 3 turn ON, thus "feeding" the new data into row 3. In other words, data is always present to the data lines of all pixels. The gate line (which is ON in ONLY one row at a time) determines the line into which the data is fed.

In one aspect, the matrix 500 further comprises a second plurality of voltage shifters (VSs) 506. Each voltage shifter 506 has an input connected to a gate line 504 and an output to supply a bias voltage on a corresponding bias line 506. As shown, there is a single voltage shifter for each bias line, however, other implementations are possible. In another aspect, the bias voltage is supplied independent of the gate voltage by other circuitry (not shown).

Based upon the above-mentioned examples describing the use of the circuit of FIG. 1, an extrapolation of the operation of the matrix 500 should be straightforward. Likewise, an explanation of capacitor, LC pixel, and LED pixel elements, as examples of matrix voltage storage circuits, are not repeated in the interest of brevity, see the explanation of FIGS. 3 and 4.

Functional Description

Figure 6:
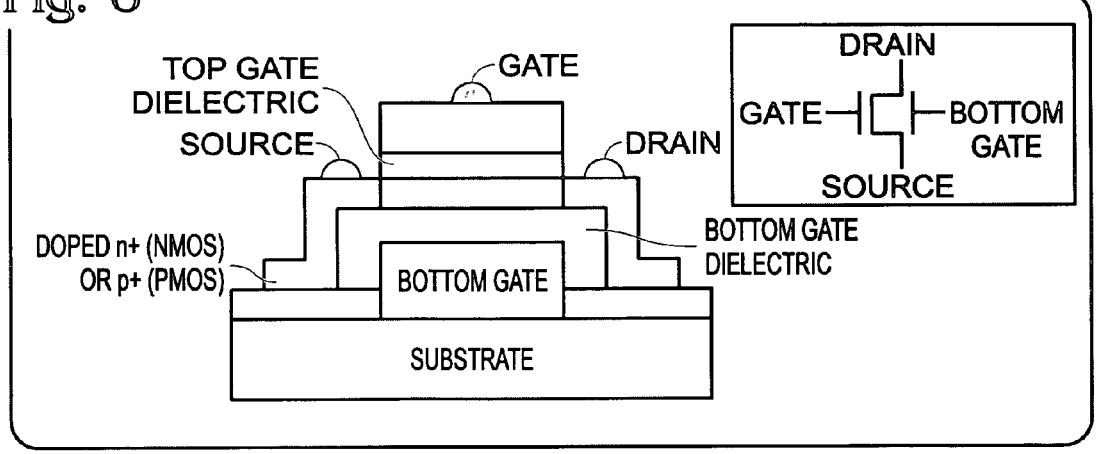
FIG. 6 is a partial cross-sectional view and schematic of an another exemplary DG-TFT.

FIG. 6 is a partial cross-sectional view and schematic of an another exemplary DG-TFT. As described above, a DG-TFT can be used as the switching element in an active-matrix. Specifically, the invention makes use of the fact that the threshold voltage of a DG-TFT can be modulated by the applied bias at the bottom (or secondary) gate terminal. The application of a bottom bias can also affect the OFF (leakage) current of the device.

When a zero bias is applied at the back gate, the transistor operates as a conventional TFT, with a threshold voltage $V_{T0}$. A negative bias $(-V_{B1})$ at the bottom gate pushes the whole channel region into accumulation (further away from depletion). Therefore, a larger bias is required by the (top) gate to invert the surface, compared to the zero bias back gate case, and the threshold voltage of the device increases to a value $V_{T1} > V_{T0}$. Inversely, a positive bias $(+V_{B2})$ at the back gate pushes the channel into depletion earlier. Thus, a lower voltage at the top gate is required to invert it, reflecting in a threshold voltage decrease of $V_{T2} < V_{T0}$.

Figure 7:
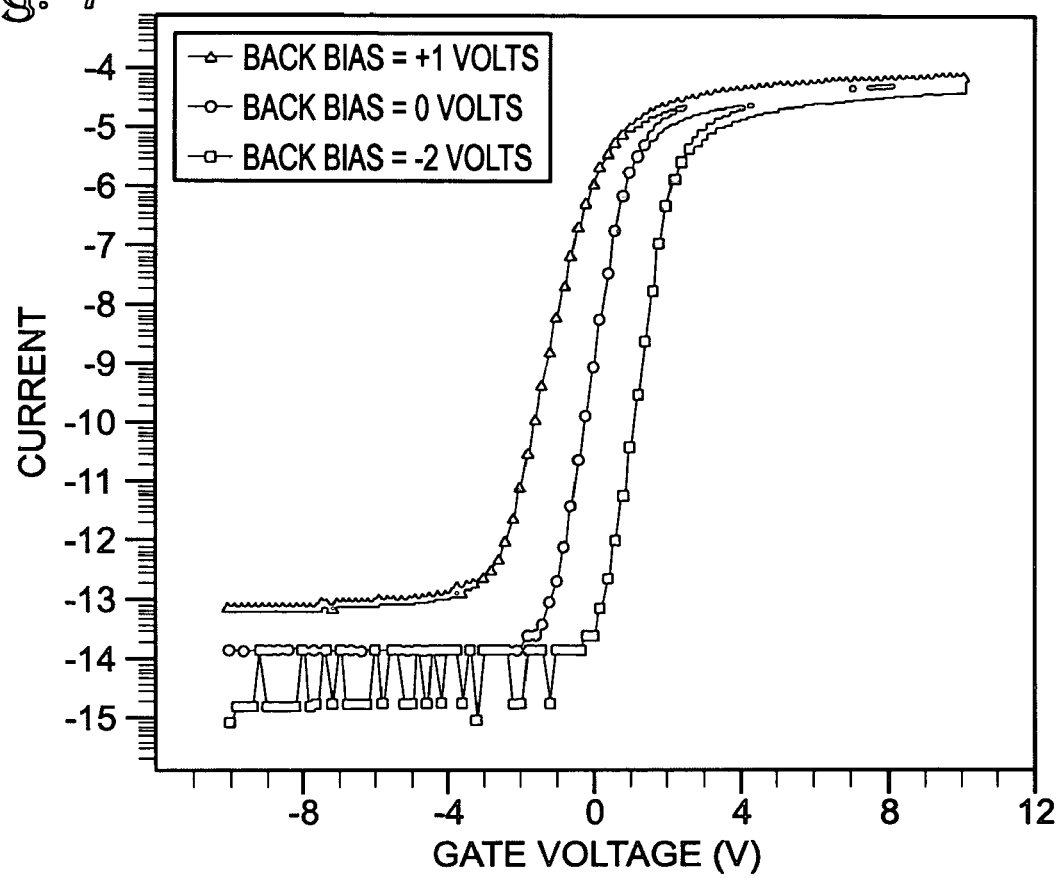
FIG. 7 is a semilog plot of current vs. voltage ($I_D$-$V_G$) for an NMOS DG-TFT.

FIG. 7 is a semilog plot of current vs. voltage ($I_D$-$V_G$) for an NMOS DG-TFT. The DG-TFT assumes a device with channel geometry W/L=8 um/1.3 um, a gate insulator thickness of 50 nanometers (nm), with $V_D$=100 mV, and a back gate bias of 0 V, −2 V ($=V_{B1}$) and +1 V ($=V_{B2}$). Note, the threshold shift caused by the back gate, as well as the leakage (OFF) current difference. The left-most trace depicts a DG-TFT biased for fast charging, while the right-most trace depicts a DG-TFT biased for storage.

With these characteristics, a DG-TFT can be employed as a pixel switching element of a display matrix, and controlled externally. Depending on the control signal, the switching characteristics of the pixel can be changed dynamically, in order to optimize the pixel delay time. This means that very effective pixel architectures can be constructed inexpensively, with a minimum of active components.

Figure 8:
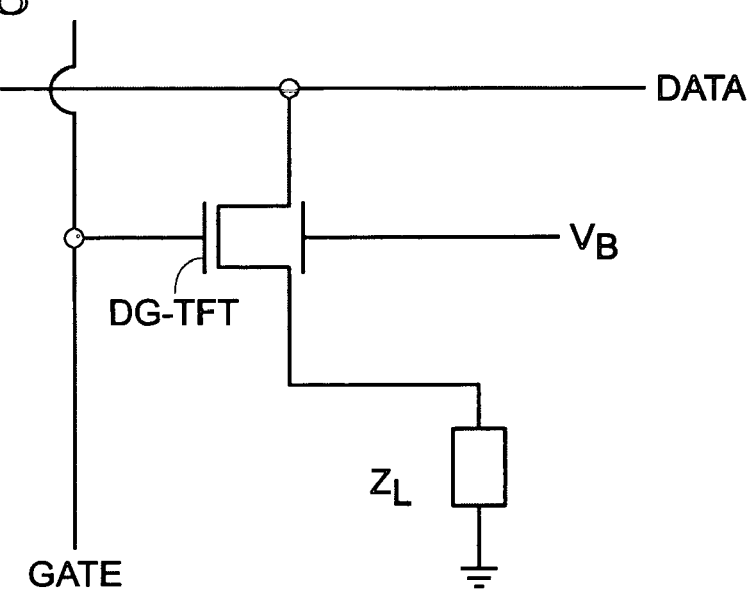
FIG. 8 is a schematic representation of a pixel architecture using a DG-TFT controlled by a back-gate bias $V_B$.

FIG. 8 is a schematic representation of a pixel architecture using a DG-TFT controlled by a back-gate bias $V_B$. The circuit substitutes a conventional TFT pixel switching element with a dual gate TFT. Since the operation of the DG-TFT with zero back-gate bias is ideally identical with the operation of a conventional TFT, the circuit is equivalent to a conventional pixel when no gate bias is used.

The operation of the circuit is as follows. With a zero back gate bias $V_B$, and assuming the voltage at the gate and data lines is high ($=V_{DD}$), the switching transistor is ON. The pixel charge time constant TON is a measure of how long it takes to refresh the voltage (or current) stored at the pixel, and is approximated as:

$$T_{ON} \approx \frac{2V_{DD}LC_L}{\mu C_{OX} W(V_{DD} - V_T)^2} \quad (1)$$

A purely capacitive load impedance ($Z_L = C_L$) is assumed, as is often the case. $V_T$ is the device threshold voltage, and u is the channel mobility. It is advantageous to decrease this delay time as much as possible. Mathematically, the most effective way to do this is by affecting the squared term. The DG-TFT circuit takes advantage of the fact that $V_T$ is controlled by the back gate bias $V_B$. Consequently, when the TFT is ON, a positive bias is applied at $V_B$, causing $V_T$ to drop and, thus, reduce $T_{ON}$.

When the switching TFT is OFF (i.e. the pixel is not selected to be updated), it is important to retain the stored current or voltage value for as long as possible. However, no transistor is an ideal switch, and even in its OFF state there is a finite amount of channel resistance. Therefore, the voltage (or current) stored in the pixel slowly "leaks", as the storage element discharges. This discharge is determined by the leakage current of the TFT (see FIG. 7). The discharge time constant $T_{OFF}$ may be approximated by:

$$T_{OFF} \approx \frac{V_{DD}C_L}{2I_{OFF}} \quad (2)$$

$I_{OFF}$ is the OFF current of the TFT. In the OFF case, it is important to have the minimum leakage current in the switching TFT, so that $T_{OFF}$ is as large as possible. When the TFT is OFF, a positive bias is applied at $V_B$, causing $V_T$ to increase and, thus, increase the discharge time constant. Table 1 represents TFT metrics extracted for each $V_B$ bias, based on the data of FIG. 7.

TABLE 1

| | TFT characteristics | | |
|---|---|---|---|
| $V_B$ (V) | u (cm$^2$/Vs) | $V_T$ (V) | $I_{OFF}$ (A) |
| 0 | 289.2 | 0.96 | $1.5 \times 10^{-14}$ |
| −2 | 229.0 | 2.16 | $4.0 \times 10^{-15}$ |
| +1 | 312.3 | 0.22 | $1.0 \times 10^{-13}$ |

Based on the values of Table 1 and equations (1)-(2), the delay times have been calculated for $V_B$=0V (conventional TFT), for a positive $V_B$ (DG-TFT is ON), and for a negative $V_B$ (GD-TFT is OFF). The results are shown in Table 2.

TABLE 2

| Assuming $V_{DD}$ = 5 V and $C_L$ = 100 fF | | |
|---|---|---|
| | $T_{ON}$ (ns) | $T_{OFF}$ (s) |
| conventional TFT ($V_B$ = 0V) | 4.99 | 16.6 |
| DG-TFT | 3.30 | 62.5 |

The values of Table 2 are presented as an example of operation. Higher gains are possible by optimizing the scale of $V_B$ and proper TFT engineering for $V_T$ positioning.

DG-TFT Active-Matrix Scheme

Figure 9:
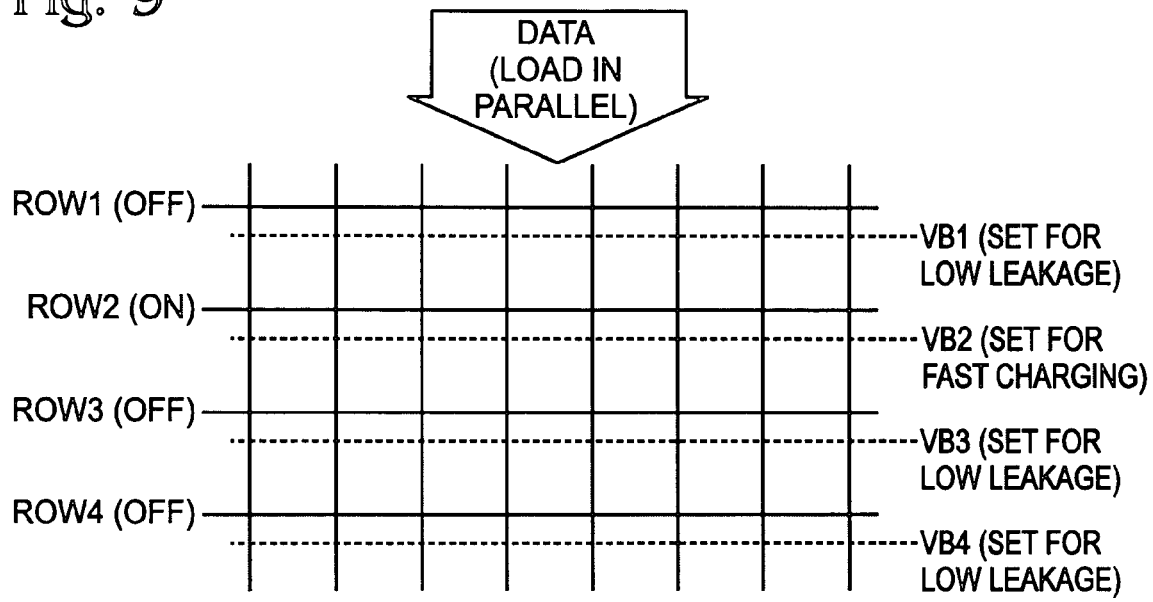
FIG. 9 is a schematic drawing of an active-matrix display with bias voltage lines.

FIG. 9 is a schematic drawing of an active-matrix display with bias voltage lines. In contrast to the active matrix of FIG. 17, the AM of FIG. 9 adds one extra line per row, to supply a bias voltage to DG-TFTs. The signals applied in the VB rows, which control the back-gate of the switching TFTs, relate to the signals in a corresponding Row. Only the Row currently ON is set for fast charging. All the other (inactive) Rows are set for low leakage rate.

Figure 10:
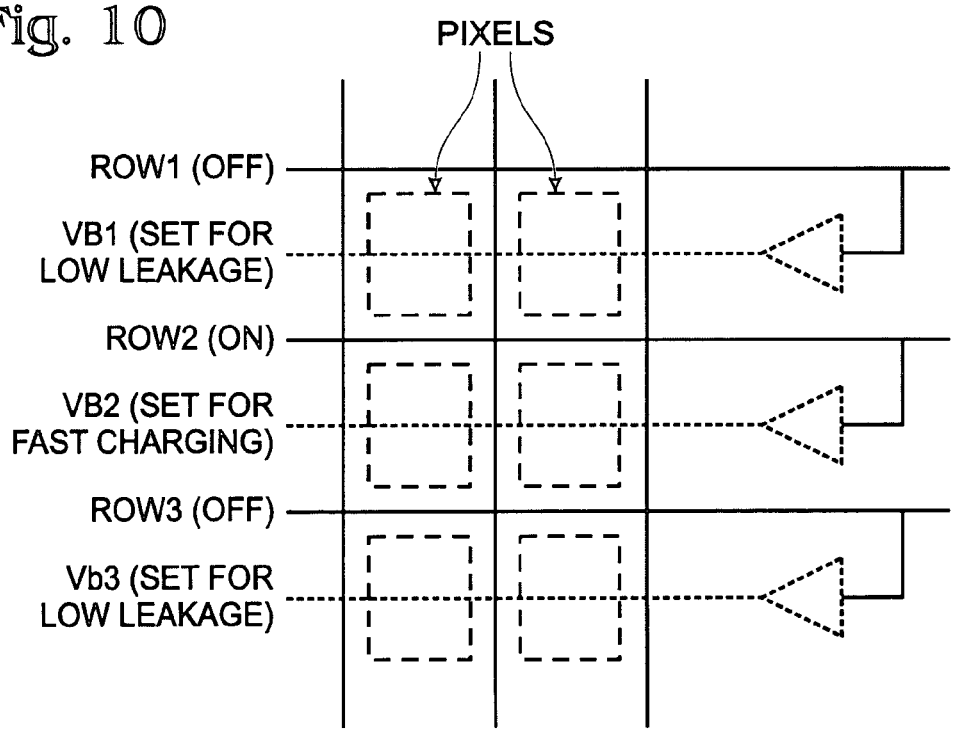
FIG. 10 is a schematic diagram depicting the AM display of FIG. 9, with the addition of voltage shifters.

FIG. 10 is a schematic diagram depicting the AM display of FIG. 9, with the addition of voltage shifters. The triangles represent voltage shifters, which translate the logic level of the rows (for example, 0 to 5 V) to the voltage level for the bottom gate of the DG-TFTs (for example, −2 to +1 V).

Figure 14:
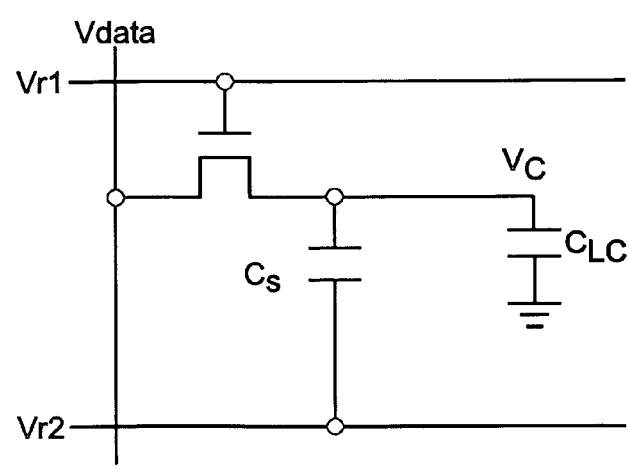
FIG. 14 is a schematic depicting a conventional LCD display pixel architecture, employing amorphous-Si or low-temperature polycrystalline silicon N-channel TFTs (prior art).
Figure 11:
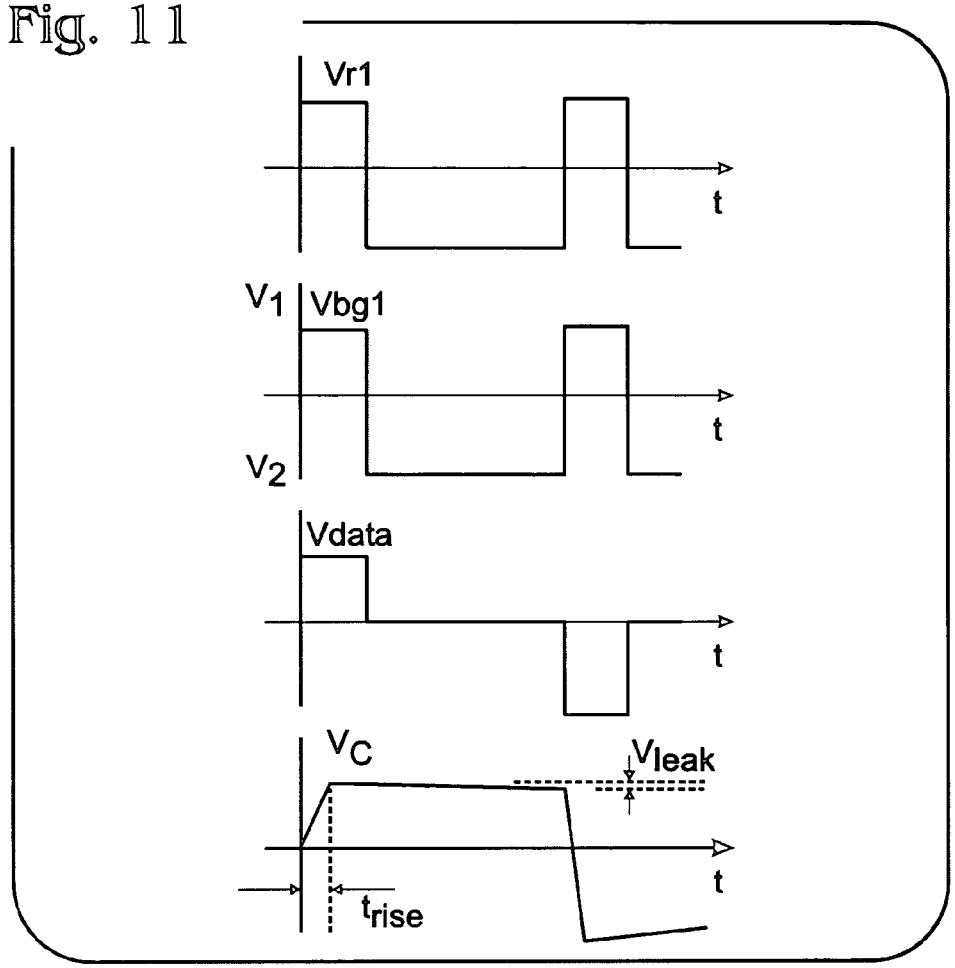
FIG. 11 is a signal diagram of the DG-TFT LCD pixel architecture of FIG. 3.
Figure 13:
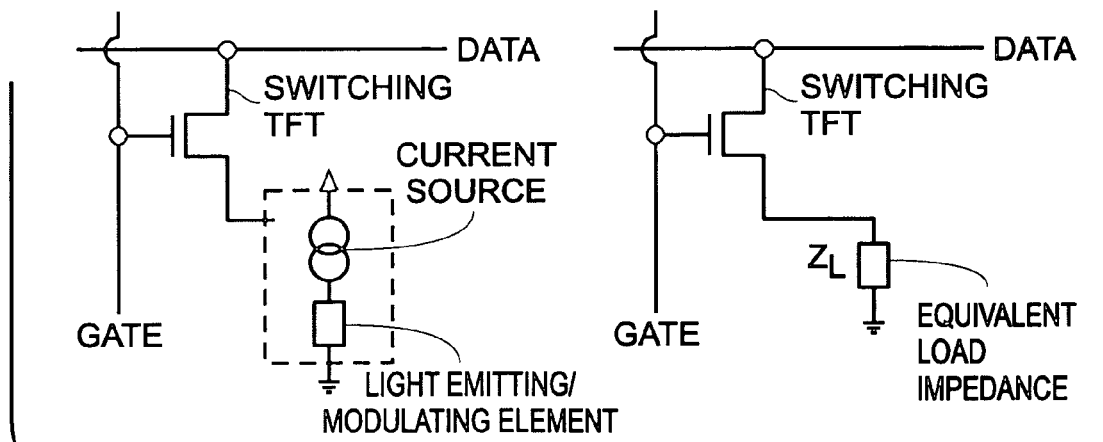
FIG. 13 is a schematic drawing depicting two examples of conventional active matrix system pixels (prior art).
Figure 15:
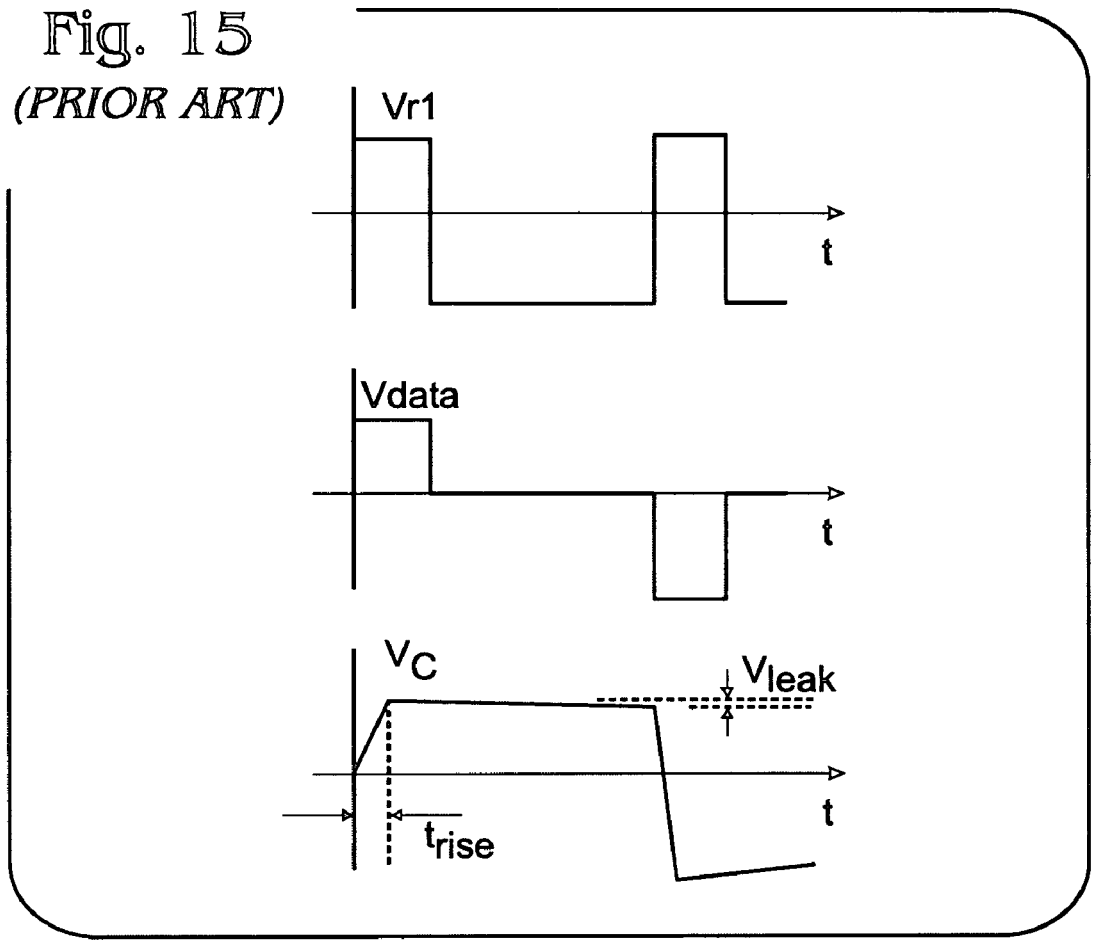
FIG. 15 is a signal diagram for the circuit of FIG. 14 (prior art).
Figure 16:
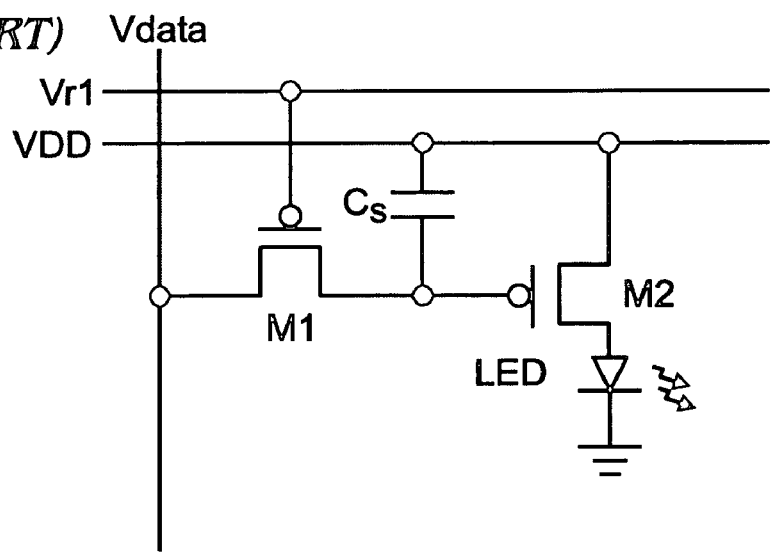
FIG. 16 is a schematic drawing of a conventional LED pixel architecture (prior art).

FIG. 11 is a signal diagram of the DG-TFT LCD pixel architecture of FIG. 3. In contrast to the conventional LCD pixel of FIGS. 14 and 15, the switching TFT has been replaced by a DG-TFT, and the pixel is redesigned to accommodate the back-gate bias line Vbg. This line is common to all pixels in this row.

The timing diagram shows that the signals employed in the conventional implementation (Vdata, Vr1, Vr2, etc) are maintained. When Vr1 is about to be turned on, Vbg1 turns on to a positive level $V_1$. This causes the DG-TFT to exhibit a threshold voltage lower than its default, zero bias case. The lower threshold voltage causes the channel resistance of the TFT to decrease. Thus, capacitors $C_S$ and $C_{LC}$ charge at a faster rate, as indicate by the shorter $t_{rise}$ of the $V_C$ plot.

After the new data is stored in the capacitors, Vr1 turns OFF, and Vbg1 reverts to a bias level $V_2$. This bias causes the TFT to have a much higher threshold voltage than before, and lower leakage current. Hence, the TFT has a higher channel resistance and leakage through the channel is decreased. This is indicated schematically by the lower $V_{leak}$ in the plot of $V_C$.

The bias levels $V_1$ and $V_2$ are predetermined, based on the characteristics of the DG-TFT. In one implementation, Vbg is obtained from Vr just by appropriate shifting of the amplitude levels.

The proposed pixel architecture is advantageous for high resolution displays, since the leakage time determines how fast a pixel is refreshed. With lower leakage, higher resolutions are possible with the same driving scheme and pixel architecture. The faster pixel charging associated with a DG-TFT pixel has the advantage of enabling higher frame rates, while also supporting higher display resolutions, by reducing the size of the storage element $C_S$, as compared to the conventional architecture. Since the channel resistance of the TFT is dynamically decreased, $C_S$ does not need to be as large as in the conventional architecture, in order to obtain the same $V_{leak}$. This results in smaller pixel dimensions.

Figure 12:
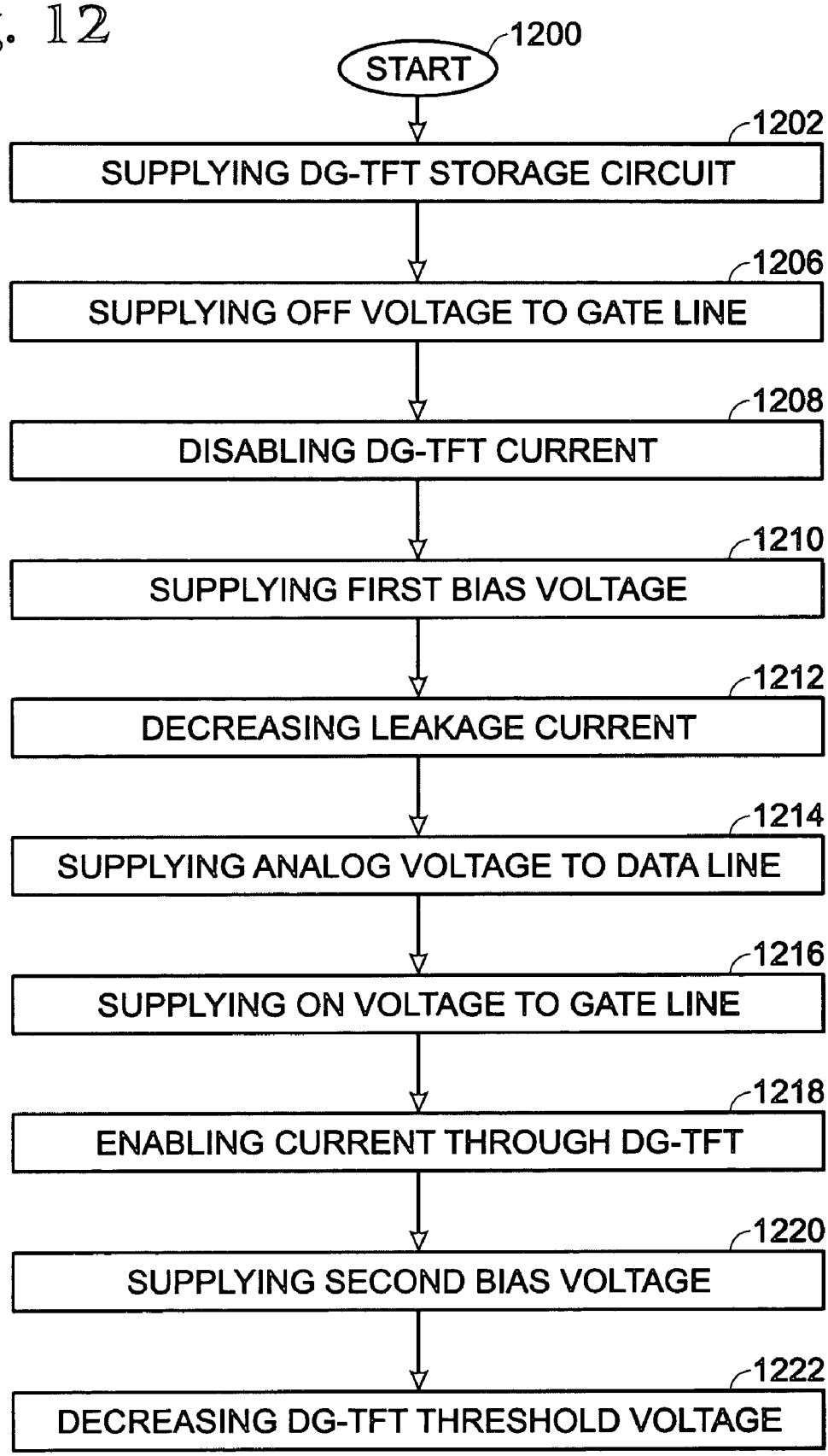
FIG. 12 is a flowchart illustrating a method for controlling a DG-TFT voltage storage circuit.

FIG. 12 is a flowchart illustrating a method for controlling a DG-TFT voltage storage circuit. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1200.

Step 1202 supplies a circuit with a voltage storage element, a DG-TFT having a first source/drain (S/D) connected to a data line, a top gate connected to a gate line, a second S/D region connected to the voltage storage element, and a bottom gate connected to a bias line. For example, the voltage storage may be a capacitor, an LC pixel, or an LED pixel. Step 1206 supplies an OFF voltage to the gate line. Step 1208 disables current through the DG-TFT to the voltage storage element in response to the OFF voltage. Step 1210 supplies a first bias voltage to the bias line. Step 1212 decreases the leakage current through the DG-TFT in response to the first bias voltage. Alternately stated, the voltage storage element maintains its charge or stored voltage (decreases its current leakage) in response to the first bias voltage.

In another aspect, Step 1214 supplies an analog (storage) voltage to the data line. Step 1216 supplies an ON voltage to the gate line. Step 1218 enables current flow through the DG-TFT to the voltage storage element. Step 1220 supplies a second bias voltage to the bias line. Step 1222 decreases the threshold voltage of the DG-TFT in response to the second bias voltage. Alternately stated, the voltage storage element is charged more quickly, reaches its storage voltage level, or increases its input charging current in response to the second bias voltage.

In another aspect, supplying the first bias voltage in Step 1210 includes converting the gate OFF voltage to the first bias voltage. Likewise, supplying the second bias voltage in Step 1220 may include converting the gate ON voltage to the second bias voltage.

A voltage storage circuit has been provided, enabled through the use of a DG-TFT. Examples of particular circuit layouts and elements have been presented to illustrate the invention. However, the invention is not limited to merely these examples. Other variations and embodiments of the invention will occur to those skilled in the art.

We claim:

1. A dual-gate thin-film transistor (DG-TFT) voltage storage circuit, the circuit comprising:
   a voltage storage element having an input, and an output;
   a DG-TFT having a first source/drain (S/D) connected to a data line, a top gate connected to a first gate line, a second S/D region connected to the voltage storage element input, and a bottom gate connected to a bias line; and,
   a voltage shifter having an input connected to the first gate line to accept a voltage, and an output to supply a bias voltage on the bias line, different than the voltage on the first gate line.

2. The circuit of claim 1 wherein the DG-TFT bottom gate is aligned in a first horizontal plane;
   wherein the first S/D region and second S/D region are aligned in a second horizontal plane, overlying the first plane;
   wherein the top gate is aligned in a third horizontal plane, overlying the second plane; and,
   wherein the DG-TFT further comprises:
   a channel region in the second horizontal plane, intervening between the first and second S/D regions.

3. The circuit of claim 2 wherein the bottom gate has vertical sides; and,
   the DG-TFT further comprising:
   insulating sidewalls over the bottom gate vertical sides; and,
   wherein the first and second S/D regions overlie the bottom gate, between the bottom gate vertical sides.

4. The circuit of claim 1 wherein the first gate line accepts an OFF voltage;
   wherein the voltage shifter supplies a first bias voltage; and,
   wherein the leakage current through the DG-TFT decreases in response to the first bias voltage.

5. The circuit of claim 1 wherein the data line accepts an analog voltage;
   wherein the first gate line accepts an ON voltage;
   wherein the voltage shifter supplies a second bias voltage; and,
   wherein the voltage threshold of the DG-TFT decreases in response to the second bias voltage.

6. The circuit of claim 1 wherein the voltage storage element is selected from the group comprising a capacitor, a liquid crystal (LC) pixel, and a light emitting diode (LED) pixel.

7. The circuit of claim 1 wherein the voltage storage element is an LC pixel comprising:
   an LC element having a first terminal connected to the DG-TFT second S/D region, and a second terminal connected to a reference voltage; and,
   a storage capacitor having a first terminal connected to the DG-TFT second S/D region, and a second terminal connected to a second gate line, adjacent the first gate line.

8. A dual-gate thin-film transistor (DG-TFT) voltage storage matrix, the matrix comprising:
   a plurality of data lines;
   a plurality of gate lines;
   a plurality of bias lines, each bias line being associated with a corresponding gate line;
   a plurality of voltage shifters, each voltage shifter having an input connected to a corresponding gate line and an output to supply a bias voltage on a corresponding bias line, different than the voltage on the corresponding rate line; and,
   a plurality of DG-TFT voltage storage circuits, with a unique circuit intervening between each data line and each gate line, each circuit comprising:
      a voltage storage element having an input, and an output; and,
      a DG-TFT having a first source/drain (S/D) connected to a data line, a top gate connected to a gate line, a second S/D region connected to the voltage storage element input, and a bottom gate connected to a bias line.

9. The matrix of claim 8 wherein the DG-TFT bottom gate is aligned in a first horizontal plane;
   wherein the first S/D region and second S/D region are aligned in a second horizontal plane, overlying the first plane;
   wherein the top gate is aligned in a third horizontal plane, overlying the second plane; and,
   wherein the DG-TFT further comprises:
   a channel region in the second horizontal plane, intervening between the first and second S/D regions.

10. The matrix of claim 9 wherein the bottom gate has vertical sides; and,
    the DG-TFT further comprising:
    insulating sidewalls over the bottom gate vertical sides; and,
    wherein the first and second S/D regions overlie the bottom gate, between the bottom gate vertical sides.

11. The matrix of claim 8 wherein a first gate line accepts an OFF voltage;
    wherein a first voltage shifter, connected to the first gate line, supplies a first bias voltage; and,
    wherein the leakage current through a first DG-TFT, connected to the first data line and the first gate line, decreases in response to the first bias voltage.

12. The matrix of claim 8 wherein a first data line accepts an analog voltage;
    wherein a first gate line accepts an ON voltage;
    wherein a first voltage shifter, connected to the first gate line, supplies a second bias voltage; and,
    wherein the threshold voltage of a first DG-TFT, connected to the first data line and the first gate line, decreases in response to the second bias voltage.

13. The matrix of claim 8 wherein the voltage storage element is selected from the group including a capacitor, a liquid crystal (LC) pixel, and a light emitting diode (LED) pixel.

14. The matrix of claim 8 wherein the matrix is an LC display (LCD);
    wherein the voltage storage element is an LC pixel comprising:
    an LC element having a first terminal connected to the DG-TFT second S/D region, and a second terminal connected to a reference voltage; and,
    a storage capacitor having a first terminal connected to the DG-TFT second S/D region, and a second terminal connected to a gate line, adjacent the DG-TFT gate line.

15. A method for controlling a dual-gate thin-film transistor (DG-TFT) voltage storage circuit, the method comprising:
    supplying a circuit with a voltage storage element, a DG-TFT having a first source/drain (S/D) connected to a data line, a top gate connected to a gate line, a second S/D region connected to the voltage storage element, a bottom gate connected to a bias line, and a voltage shifter to accept a voltage on the gate line and to supply a voltage to the bias line, different than the voltage on the gate line;
    supplying an OFF voltage to the gate line;

in response to the OFF voltage, disabling current through the DG-TFT to the voltage storage element;
supplying a first bias voltage to the bias line; and,
decreasing the leakage current through the DG-TFT in response to the first bias voltage.

16. The method of claim 15 further comprising:
supplying an analog voltage to the data line;
supplying an ON voltage to the gate line;
enabling current flow through the DG-TFT to the voltage storage element;
supplying a second bias voltage to the bias line; and,
decreasing the threshold voltage of the DG-TFT in response to the second bias voltage.

17. The method of claim 16 wherein supplying the first bias voltage includes converting the gate OFF voltage to the first bias voltage; and, wherein supplying the second bias voltage includes converting the gate ON voltage to the second bias voltage.

18. The method of claim 15 wherein supplying the circuit with the voltage storage element includes supplying a voltage storage element selected from the group comprising a capacitor, a liquid crystal (LC) pixel, and a light emitting diode (LED) pixel.

* * * * *